(12) United States Patent
Peng et al.

(10) Patent No.: US 8,734,212 B2
(45) Date of Patent: May 27, 2014

(54) CONTAINER DATA CENTER HAVING HIGH HEAT DISSIPATION EFFICIENCY

(75) Inventors: Wen-Tang Peng, New Taipei (TW);
Yi-Liang Hsiao, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 291 days.

(21) Appl. No.: 13/278,120

(22) Filed: Oct. 20, 2011

(65) Prior Publication Data

US 2012/0276834 A1 Nov. 1, 2012

(30) Foreign Application Priority Data

Apr. 27, 2011 (TW) .............................. 100114694 A

(51) Int. Cl.
*H05K 5/00* (2006.01)

(52) U.S. Cl.
USPC ......................................... 454/184; 361/695

(58) Field of Classification Search
USPC ......................................... 454/184; 361/695
See application file for complete search history.

(56) References Cited

U.S. PATENT DOCUMENTS

| | | | | |
|---|---|---|---|---|
| 6,119,768 A * | 9/2000 | Dreier et al. | ............. | 165/104.33 |
| 6,889,752 B2 * | 5/2005 | Stoller | ............................. | 165/47 |
| 7,854,652 B2 * | 12/2010 | Yates et al. | ..................... | 454/184 |
| 7,961,463 B2 * | 6/2011 | Belady et al. | ................. | 361/695 |
| 7,971,446 B2 * | 7/2011 | Clidaras et al. | ............... | 62/259.2 |
| 8,047,904 B2 * | 11/2011 | Yates et al. | ..................... | 454/118 |
| 8,233,270 B2 * | 7/2012 | Pierson et al. | ........... | 361/679.02 |
| 8,320,128 B2 * | 11/2012 | Wei | ................................. | 361/695 |
| 8,331,087 B2 * | 12/2012 | Wei | ............................. | 361/679.5 |
| 8,405,977 B2 * | 3/2013 | Lin | ............................ | 361/679.51 |
| 8,427,831 B2 * | 4/2013 | Wei | ................................. | 361/699 |
| 8,498,110 B2 * | 7/2013 | Wei | ............................. | 361/679.5 |
| 2009/0229194 A1 * | 9/2009 | Armillas | ........................ | 52/79.1 |
| 2009/0241578 A1 * | 10/2009 | Carlson et al. | ............... | 62/259.2 |
| 2010/0048119 A1 * | 2/2010 | Tashiro | ........................ | 454/184 |
| 2010/0085707 A1 * | 4/2010 | Moss | ............................ | 361/695 |
| 2010/0091449 A1 * | 4/2010 | Clidaras et al. | .......... | 361/679.49 |
| 2010/0130117 A1 * | 5/2010 | Larsen | ........................... | 454/184 |
| 2010/0170277 A1 * | 7/2010 | Schmitt et al. | ............... | 62/259.2 |
| 2010/0216388 A1 * | 8/2010 | Tresh et al. | ..................... | 454/184 |
| 2010/0263830 A1 * | 10/2010 | Noteboom et al. | ........... | 165/80.2 |
| 2011/0009047 A1 * | 1/2011 | Noteboom et al. | ........... | 454/184 |
| 2011/0151765 A1 * | 6/2011 | Chen et al. | ..................... | 454/184 |
| 2011/0189936 A1 * | 8/2011 | Haspers et al. | ............... | 454/184 |
| 2012/0258654 A1 * | 10/2012 | Peng et al. | ..................... | 454/184 |

* cited by examiner

*Primary Examiner* — Steven B McAllister
*Assistant Examiner* — Jonathan Cotov
(74) *Attorney, Agent, or Firm* — Novak Druce Connolly Bove + Quigg LLP

(57) ABSTRACT

A container data center (CDC) includes a server system and two cooling systems sandwiching the servers system. The server system includes a first container and a number of servers received in the first container. Each of the cooling systems includes a second container and a cooling device received in the second container. The cooling device generates cooling air which is directed to the servers for heat dissipation.

2 Claims, 2 Drawing Sheets

CONTAINER DATA CENTER HAVING HIGH HEAT DISSIPATION EFFICIENCY

BACKGROUND

1. Technical Field

The disclosure relates to container data centers (CDCs) and, particularly, to a CDC being efficient in heat dissipation.

2. Description of Related Art

Typical CDCs include a container, a number of servers, and a cooling system. The servers and the cooling system are both received in the container, occupying most of the interior space of the container. As such, less space is reserved for heat dissipating in the container, resulting in a lower heat dissipation efficiency. In addition, it is also difficult to optimize the arrangement of the servers and the cooling system which are both in the same container to obtain a high heat dissipation efficiency of the CDC.

Therefore, it is desirable to provide a CDC, which can overcome the above-mentioned problems.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Embodiments of the present disclosure will now be described in detail with reference to the drawings.

Figure 1:
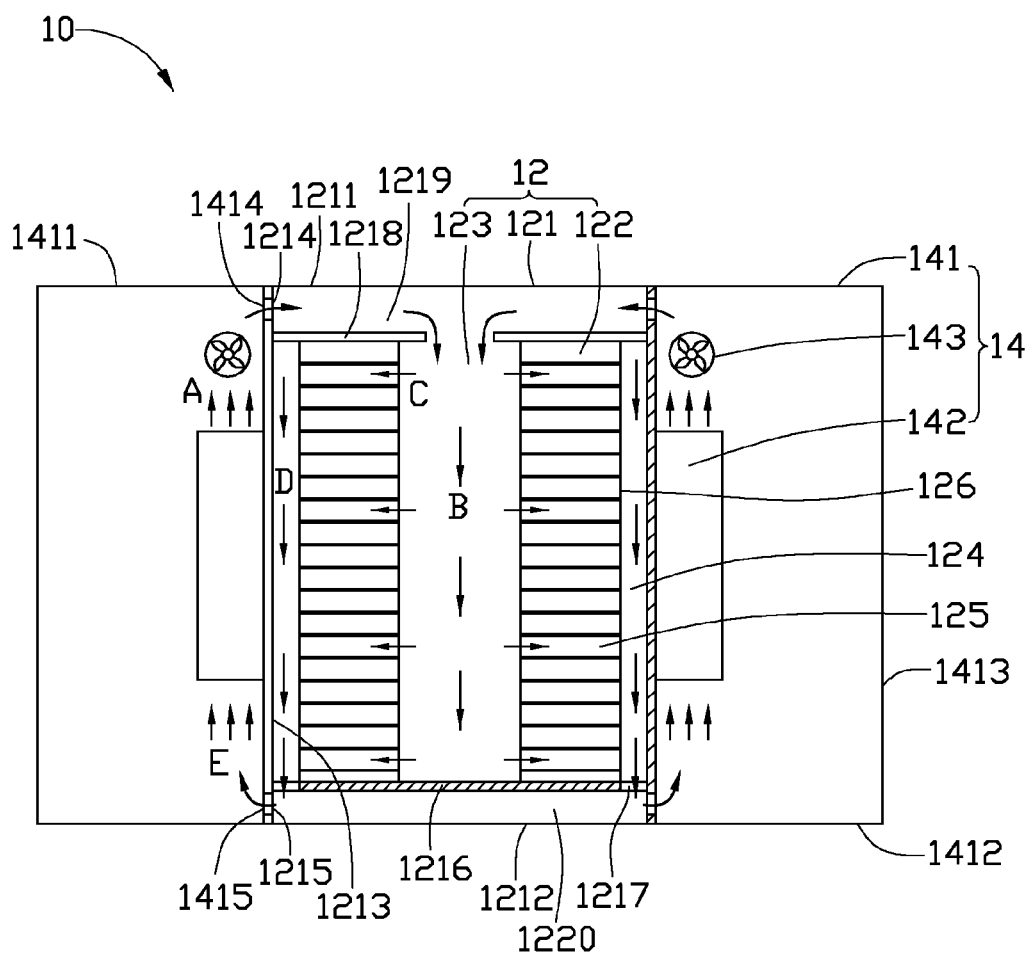
FIG. 1 is a planar schematic view of a CDC, according to an embodiment.

Referring to FIG. 1, a CDC 10, according to an embodiment, includes a server system 12 and two cooling systems 14.

The server system 12 includes a first container 121 and a number of servers 122 received in the first container 121.

The first container 121 includes a first top plate 1211, a first bottom plate 1212 opposite to the first top plate 1211, and two opposite first sidewalls 1213 connecting the first top plate 1211 and the first bottom plate 1212. The first container 121 also includes a floor 1216 positioned above the first bottom plate 1212 and a ceiling 1218 suspended from the first top plate 1211. The floor 1216 and the bottom plate 1212 cooperatively define a first space 1220, and the ceiling 1218 and the top plate 1211 cooperatively define a second space 1219. Each first sidewall 1213 defines a first opening 1214 communicating the second space 1219 with the exterior of the first container 121, and a second opening 1215 communicating the first space 1220 with the exterior of the first container 121.

The servers 122 stand on the floor 1216, almost touching the ceiling 1218, and are arranged in two rows, each of which is adjacent to and extend along the corresponding first sidewall 1213. A first air channel 123 is formed between the two rows of servers 122 and extends through the ceiling 1218, that is, the first air channel 123 communicates with the second space 1219, as such, the ceiling 1218 defines a third opening (not labeled) communicating the first channel 123 with the second space 1219. Each server 122 includes a number of units 126 stacked from the floor 1216 to the ceiling 1218. Each unit 126 defines a second channel 125. In addition, a third channel 124 is formed between each row of servers 122 and the corresponding first sidewall 1213. The floor 1216 also defines two fourth openings 1217, each of which communicates the corresponding second channel 124 with the first space 1220.

The server system 12 does not include any device for generating cooling air in this embodiment but can include a cooling device(s) for generating cooling air in other alternative embodiments.

Each cooling system 14 includes a second container 141, a cooling device 142, and an air-directing device 143. The second containers 141 sandwiches the first container 12 and are positioned adjacent to and/or contacting with the respective first sidewalls 1213. The cooling device 142 and the air directing device 143 of each cooling system 14 are received in the corresponding second container 141.

Each second container 141 includes a second top plate 1411, a second bottom plate 1412 opposite to the second top plate 1411, and two opposite second sidewalls 1413 connecting the second top plate 1411 and the second bottom plate 1412. One of the second sidewalls 1413 of each second container 141 is adjacent to or contacts with the corresponding first sidewall 1213 and defines a fifth opening 1414, communicating the interior space (not labeled) of the corresponding second container 141 with the corresponding first opening 1214 and a sixth opening 1415 communicating the interior space of the corresponding second container 141 with the corresponding second opening 1215.

The cooling devices 142, such as an air conditioner, generate cooling air and blow the cooling air to the respective second openings 1414.

The air-directing device 143, such as a blower, directs the cooling air from the respective cooling device 142 to the respective second openings 1414.

The cooling systems 14 do not include any servers in this embodiment but can include some servers in other alternative embodiments.

In operation, the cooling air is generated by the cooling device 142 and directed as flows A to the second space 1219 by the air-directing devices 143 via the fifth openings 1414 and the respective first openings 1214, flows B flowing to the first channel 123 via the third opening due to gravity, flows C flowing through the second channels 125 to dissipate heat generated by the units 126, flows D (hot air) flowing to the first space 1220 via the fourth openings 1217 due to the gravity, and flows E (hot air) to the interior space of the second container 141 via the second openings 1215 and the respective sixth openings 1415.

Figure 2:
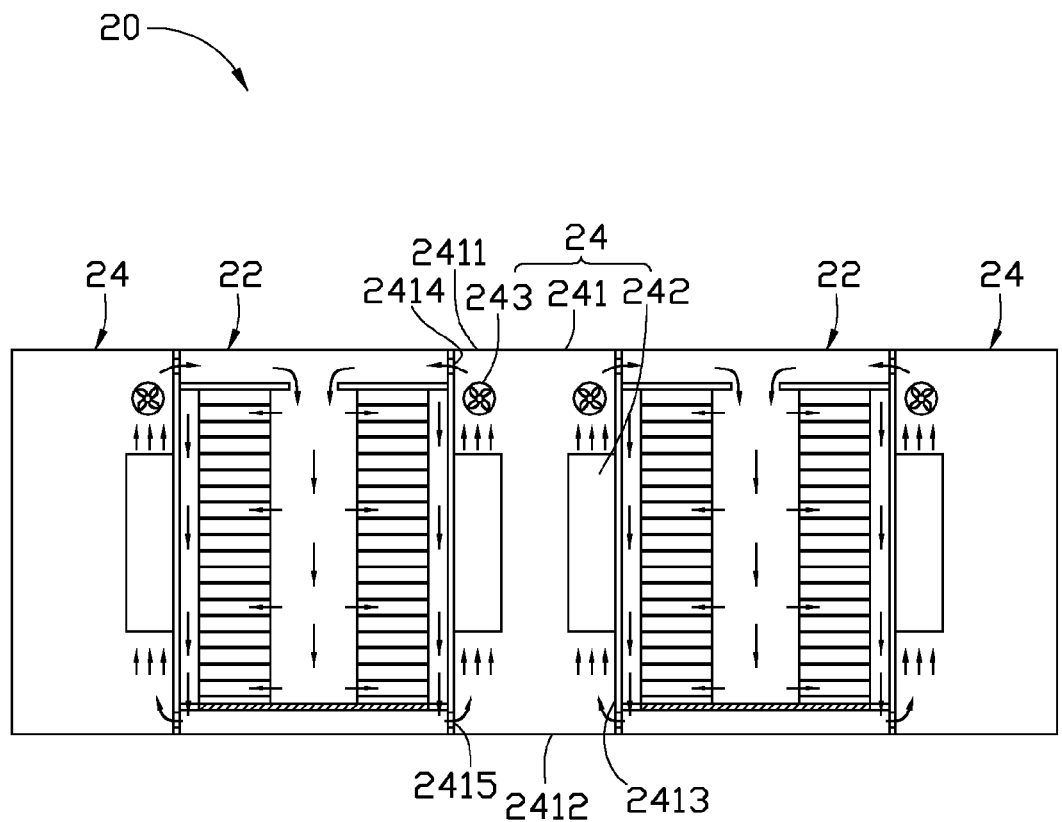
FIG. 2 is a planar schematic view a CDC, according to another embodiment.

Referring to FIG. 2, a CDC 20, according to another embodiment, includes two server systems 22 and three cooling systems 24, which are alternately arranged. Each server system 22 and the cooling systems 24 sandwiching the sever system 22 have a substantially similar structure, arrangement, operation principle with the CDC 10. However, the cooling system 24 which is sandwiched by the server systems 22 includes a second container 241, two cooling devices 242, and two air-directing devices 243. The second container 241 includes a second top plate 2411, a second bottom plate 2412, and two second sidewalls 2413. Each of the second sidewalls 2413 defines a fifth opening 2414 and a sixth opening 2415. The cooling devices 242, the air-directing devices 243, the fifth openings 2414, and the sixth openings 2415 are for the respective server systems 22.

It will be understood that the above particular embodiments are shown and described by way of illustration only. The principles and the features of the present disclosure may be employed in various and numerous embodiment thereof without departing from the scope of the disclosure as claimed. The above-described embodiments illustrate the possible scope of the disclosure but do not restrict the scope of the disclosure.

What is claimed is:

1. A container data center (CDC), comprising:
a server system comprising a first container and a plurality of servers received in the first container; and
two cooling systems, each of which comprises a second container, a cooling device and an air-directing device, the cooling device and the air-directing device being received in the second container; wherein
the first container is positioned between the second containers of the two cooling systems, an interior of the first container communicates with an interior of each of the second containers, the cooling devices are configured for generating cooling air, the air-directing devices are configured for directing the cooling air from the interior of the respective second containers to the interior of the first container;
wherein the first container comprises a first top plate, a first bottom plate opposite to the first top plate, and two opposite first sidewalls connecting the first top plate and the first bottom plate, the first container also comprises a floor positioned above the first bottom plate and a ceiling suspended from the first top plate, the floor and the bottom plate cooperatively define a first space, the ceiling and the top plate cooperatively define a second space, each first sidewall defines a first opening communicating the second space with the second container for receiving the cooling air, and a second opening communicating the first space with the second container for dissipating hot air from the first space, the servers are arranged in two rows and positioned between the floor and the ceiling, each row of servers is adjacent to and extends along a corresponding first sidewall, a first air channel is defined between the two rows of servers and extends through an opening in the ceiling, each server comprises a number of stacked units, each unit defines a second air channel, a third air channel is defined between each row of servers and the corresponding first sidewall, the second channel communicates the first air channel with the third air channel, the floor also defines two third openings, each of which communicates a corresponding third air channel with the first space.

2. The CDC of claim 1, wherein each second container comprises a second top plate, a second bottom plate opposite to the second top plate, and two opposite second sidewalls connecting the second top plate and the second bottom plate, each second sidewall adjacent to a corresponding first sidewall defines a fourth opening communicating the interior of a corresponding second container with a corresponding first opening and a sixth opening communicating the interior of the corresponding second container with a corresponding second opening.

* * * * *